United States Patent
Kadlec et al.

(10) Patent No.: US 7,718,042 B2
(45) Date of Patent: May 18, 2010

(54) METHOD FOR MANUFACTURING SPUTTER-COATED SUBSTRATES, MAGNETRON SOURCE AND SPUTTERING CHAMBER WITH SUCH SOURCE

(75) Inventors: Stanislav Kadlec, Buchs (CH); Eduard Kügler, Feldkirch-Tisis (AT); Walter Haag, Grabs (CH)

(73) Assignee: OC Oerlikon Balzers AG, Balzers (LI)

( * ) Notice: Subject to any disclaimer, the term of this patent is extended or adjusted under 35 U.S.C. 154(b) by 916 days.

(21) Appl. No.: 10/798,331

(22) Filed: Mar. 12, 2004

(65) Prior Publication Data

US 2005/0199485 A1   Sep. 15, 2005

(51) Int. Cl.
C23C 14/00 (2006.01)
C23C 14/32 (2006.01)
C25B 11/00 (2006.01)
C25B 13/00 (2006.01)

(52) U.S. Cl. ............... 204/192.12; 204/298.16; 204/298.19; 204/298.2

(58) Field of Classification Search ............ 216/67; 204/298.2, 298.19, 298.12, 298.11, 298.03, 204/192.12, 298.16; 118/723 E
See application file for complete search history.

(56) References Cited

U.S. PATENT DOCUMENTS

| | | | | |
|---|---|---|---|---|
| 4,422,896 A | * | 12/1983 | Class et al. | 216/67 |
| 4,746,417 A | * | 5/1988 | Ferenbach et al. | 204/298.2 |
| 5,069,772 A | * | 12/1991 | Fritsche et al. | 204/298.12 |
| 5,320,728 A | * | 6/1994 | Tepman | 204/192.12 |
| 5,374,343 A | * | 12/1994 | Sasaki et al. | 204/298.2 |
| 5,423,970 A | * | 6/1995 | Kugler | 204/298.03 |
| 5,744,011 A | * | 4/1998 | Okubo et al. | 204/192.12 |
| 6,155,200 A | * | 12/2000 | Horiike et al. | 118/723 E |
| 6,277,249 B1 | | 8/2001 | Gopalraja et al. | 204/192.12 |
| 6,306,265 B1 | * | 10/2001 | Fu et al. | 204/192.12 |
| 6,352,629 B1 | | 3/2002 | Wang | 204/298.2 |
| 6,398,929 B1 | * | 6/2002 | Chiang et al. | 204/298.11 |
| 6,436,251 B2 | * | 8/2002 | Gopalraja et al. | 204/298.12 |
| 6,444,104 B2 | * | 9/2002 | Gopalraja et al. | 204/298.13 |

(Continued)

FOREIGN PATENT DOCUMENTS

EP    1 067 577 A    1/2001

(Continued)

OTHER PUBLICATIONS

"The unbalanced magnetron: current status of development" Surface and Coating Technology, vol. 48, No. 1, Oct. 1, 1991 pp. 81-94.

Primary Examiner—Jennifer K Michener
Assistant Examiner—Michael Band
(74) Attorney, Agent, or Firm—Antonelli, Terry, Stout & Kraus, LLP.

(57) ABSTRACT

A magnetron source, a magnetron treatment chamber, and a method of manufacturing substrates with a vacuum plasma treated surface, generate and exploit on asymmetrically unbalanced long-range magnetron magnetic field pattern which is swept along the substrate surface for improving the ion density at a substrate surface being vacuum plasma treated. The long-range field reaches the substrate surface with a component of the magnetic field parallel to the substrate surface of at least 0.1, and preferably between 1 and 20, Gauss. The plasma treating can be sputter-coating, or etching, for example.

15 Claims, 11 Drawing Sheets

U.S. PATENT DOCUMENTS

| | | | |
|---|---|---|---|
| 6,491,801 B1 * | 12/2002 | Gung | 204/298.2 |
| 6,663,754 B2 * | 12/2003 | Gung | 204/298.19 |
| 6,837,975 B2 * | 1/2005 | Wang et al. | 204/298.22 |
| 7,119,489 B2 * | 10/2006 | Shin et al. | 315/39.51 |
| 2001/0050220 A1 * | 12/2001 | Chiang et al. | 204/192.12 |
| 2004/0020768 A1 | 2/2004 | Wang et al. | 204/298.2 |
| 2004/0035692 A1 | 2/2004 | Ding et al. | 204/192.12 |

FOREIGN PATENT DOCUMENTS

| | | |
|---|---|---|
| WO | WO 2004/017356 A2 | 2/2004 |

\* cited by examiner

METHOD FOR MANUFACTURING SPUTTER-COATED SUBSTRATES, MAGNETRON SOURCE AND SPUTTERING CHAMBER WITH SUCH SOURCE

TECHNICAL FIELD

The present invention relates to plasma treating substrate surfaces, thereby especially to sputter-coating such surfaces and even more specifically to directional sputtering realized as long-throw sputtering and/or ionized physical vapor deposition (IPVD). It possibly may also be applied for etching.

BACKGROUND

So-called collimated sputtering and long-throw sputtering have been used for coating moderate aspect ratio holes. Ionized Physical Vapor Deposition, IPVD, has been used more recently to deposit films in holes. In the IPVD method a flux of ionized metal atoms is used. Such flux of positively charged metal ions is accelerated in the gap between the plasma and the substrate, e.g. a silicon wafer which has a negative bias with respect to the plasma. As the electric field is perpendicular to the substrate as to a silicon wafer surface, this results in a superior bottom coverage of high aspect ratio holes. There are various ways how to achieve high ionization fraction of metal for IPVD. One way is known from the U.S. Pat. No. 6,352,629. Before discussing this prior art and proceeding to the present invention some definitions shall be established:

1. Magnetron Magnetic Field Pattern

Figure 1:
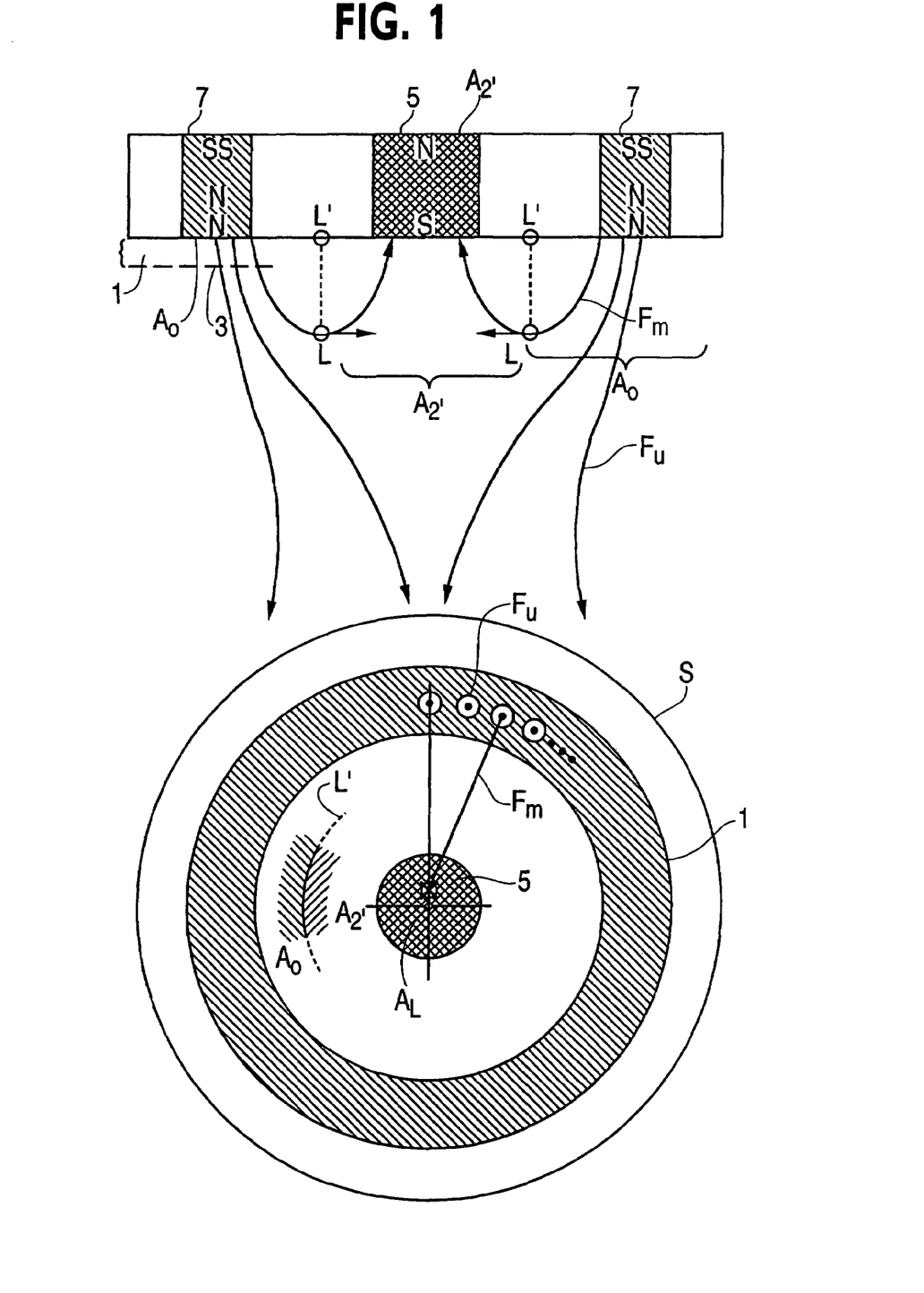
FIG. 1 schematically shows the generation of a magnetron field pattern $F_m$ and, additionally, of an unbalanced field pattern $F_u$ in relation to a first inner magnet subarrangement and a second outer magnet subarrangement and target.

As exemplified in FIG. 1 a magnetron magnetic field pattern as established along a target surface 3 of a target 1 comprises, seen towards the target surface 3, a pattern of magnetic field $F_M$ which forms a closed loop. In a cross-sectional view onto the target the magnetron magnetic field pattern $F_M$ is tunnel-shaped with magnetic field arcing from an outer area $A_o$ of one magnetic polarity to an adjacent inner area $A_i$ with the other magnetic polarity. The magnetic flux out of the outer area $A_o$ which forms a substantially closed loop is substantially equal to the magnetic flux at the second, inner area $A_i$ except the signum.

Thereby, we define the outer area $A_o$ as confined by a closed loop locus line L' which is defined by the projection (dashed lines) of the locus L along the magnetic field pattern $F_M$ along which the component of magnetic field perpendicular to the target surface 3 is zero.

Further, whenever the present invention is applied with etching the target surface 3 is of a non-sputtered material. For the preferred application of the present invention, i.e. for sputter-coating the target surface 3, the target surface is of a material to be sputtered and is therefore a sputtering surface.

2. Magnetron Magnetic Field with Unbalanced Component Pattern

The magnetron magnetic field pattern becomes unbalanced if, departing from the balanced configuration as of (1), the magnetic flux along one of the inner $A_i$ and of the outer—$A_o$—areas is increased relative to such flux at the other area. In FIG. 1 there is schematically shown the generation of the magnetron magnetic field pattern $F_M$ and, additionally, of an unbalanced field pattern $F_U$. Along the target 1 and adjacent the target surface opposite to the target surface 3 there is provided a magnet arrangement with an inner magnet subarrangement 5 and a second outer magnet subarrangement 7. The surface of first subarrangement 5 facing the target 1 is of one magnet polarity, S, whereas the surface of the outer subarrangement 7 facing target 1 has the second magnet polarity, N. Between the two magnet subarrangements there is formed the magnetron field pattern $F_M$, whereby the magnetic flux at the surfaces of the two magnet subarrangements 7 and 5 is substantially equal.

Whereas in FIG. 1 the field pattern $F_M$ is generated by means of magnet subarrangements 5 and 7, which respectively have magnetic dipoles oriented perpendicularly to the target surface 3, this field pattern $F_M$ may also be generated by respective magnet arrangements with magnetic dipoles substantially parallel to the target surface 3, one pole providing for the magnetic flux at the inner area $A_i$, the other magnetic pole for the magnetic flux at the outer area $A_o$.

The magnetron field pattern becomes unbalanced if according to FIG. 1 the magnetic flux at one of the respective surfaces with the subarrangements 5 and 7, according to FIG. 1 at the outer area $A_o$, is significantly increased. There occurs, compared with the magnetron field pattern $F_M$, a considerable amount of magnetic flux $F_U$ with long range. In FIG. 1 as an example there is shown a centered circular arrangement of the two subarrangements 5 and 7 with respect to a loop central axis $A_L$.

The unbalanced field pattern $F_U$ is evenly distributed along the outer magnet subarrangement 7.

Such known unbalanced field pattern $F_U$ is thus the result of increasing the magnetic flux e.g. at the outer area $A_o$ with a homogeneous increase of magnetic flux density along a loop of that area $A_o$. In view of the present invention we call such unbalanced field pattern $F_U$ as of FIG. 1 a symmetrically unbalanced field pattern.

Turning to the U.S. Pat. No. 6,352,629 it may be seen that there is provided a magnet arrangement which generates a symmetrically unbalanced field pattern as was explained with the help of FIG. 1, which is moved around an axis offset from the loop central axis $A_L$ of the symmetrically unbalanced circular magnetron. There is provided a DC coil which is wrapped around the space between the target and the substrate being sputter-coated so as to generate an axial magnetic field guiding metal ions towards the substrate. The target area which is covered by the symmetrically unbalanced magnetron field pattern is considerably smaller than the overall sputtering surface.

As a symmetrically unbalanced magnetron as shown in FIG. 1 generates an extremely focused plasma on the loop central axis, the ion density at the substrate is strongly inhomogeneous.

DESCRIPTION OF THE INVENTION

It is an object of the present invention to provide a method for manufacturing substrates with a vacuum plasma treated surface with an improved averaged homogeneity of plasma density distribution over the substrate surface and accordingly to propose a respective magnetron source and treatment chamber. Applied for IPVD, the present invention, due to the addressed homogeneity of plasma exposure along the substrate surface, leads to an improved homogeneity of averaged metal ion exposure of the substrate surface. The addressed object is reached by the method of manufacturing substrates with a plasma treated surface which comprises the steps of providing a target with a target surface;

providing at least one substrate, i.e. one single substrate or more than one substrate, distant from and opposite the target surface.

Along the target surface there is generated a magnetic field pattern of a magnetron field—as of $F_M$ of FIG. 1—forming a closed loop considered in direction towards the sputtering surface and, considered parallel to the sputtering surface, tunnel-like arcing from an outer area—$A_o$—of first magnetic pole to an inner area—$A_i$—of second magnetic pole, whereby the inner area—$A_i$—is confined with respect to the outer area—$A_o$—by a closed locus—L'—of zero component of magnetic field perpendicular to the target surface of the magnetron field pattern—$F_M$.

The magnetic field pattern further comprises an unbalanced long-range field pattern which is asymmetrical and is generated by increasing magnetic flux along the outer area relative to magnetic flux along the inner area, whereby the long range field reaches the substrate surface with a component of magnetic field parallel to the substrate surface of at least 0.1 Gauss. In the magnetic field pattern there is generated a plasma discharge and the substrate surface is plasma treated, whereby the asymmetrically unbalanced field pattern is swept along the substrate surface.

Thus, not a symmetrically unbalanced magnetron, but an asymmetrically unbalanced magnetron is exploited.

3. Asymmetrically Unbalanced Magnetron Field Pattern

Figure 2:
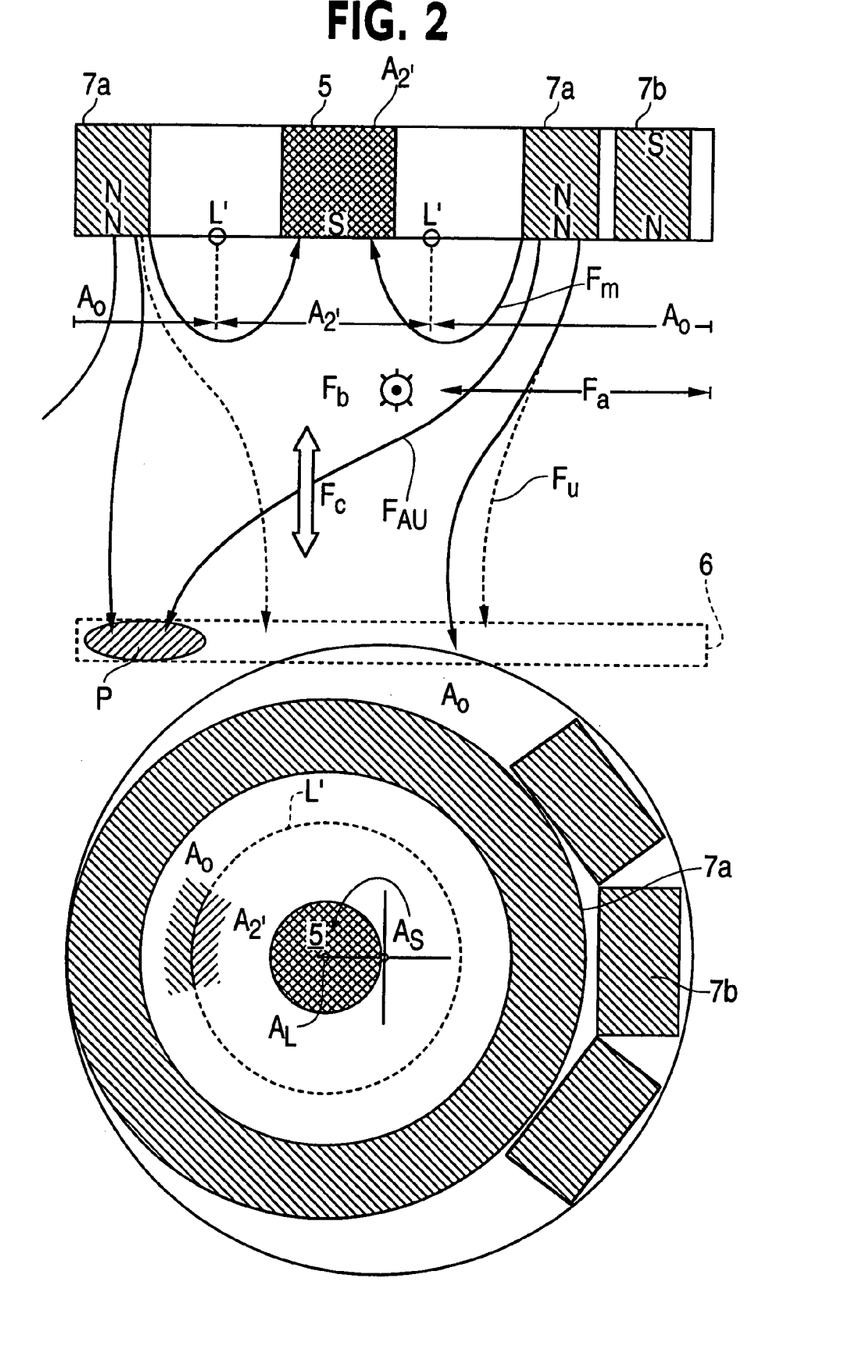
FIG. 2 schematically shows the generation of a magnetron field pattern $F_m$ and, additionally, of an asymmetrically unbalanced field pattern $F_{AU}$ in relation to a first, inner magnet subarrangement and a second, outer magnet subarrangement of a magnetron according to the present invention.

So as to fully understand the present invention as is going to be described with preferred embodiments the principal of an asymmetrically unbalanced magnetron as inventively exploited by the present invention shall be exemplified with the help of FIG. 2.

According to FIG. 2 there is generated in analogy to the embodiment of FIG. 1 the magnetron magnetic field pattern $F_M$. As further shown in FIG. 2 the magnetic flux along the surface of the second, outer magnet subarrangement $7_a$ is increased. If this was done homogeneously distributed along the outer magnet subarrangement 7 this would lead to a symmetrically unbalanced field pattern component $F_U$ according to FIG. 1 and as introduced in FIG. 2 in dashed lines.

Nevertheless, and according to the present invention as shown in FIG. 2 the inventively exploited asymmetrically unbalanced field pattern $F_{AU}$ is most generically realized by disturbing the symmetrically unbalanced field pattern $F_U$ so that the respective field pattern is distorted in a direction parallel to the target surface 3 (see FIG. 1). This is performed in a preferred embodiment by inhomogeneously increasing the magnetic flux density along the outer area $A_o$. As exemplified in FIG. 2 such inhomogeneous increasing of magnetic flux density in an azimuthal direction along the outer area $A_o$ is realized in one preferred embodiment in that there is locally applied a further magnetic field along a loop in the outer area as by providing along the outer area $A_o$ additionally to the first part $7a$ of magnet subarrangement 7—which provides for symmetrically unbalanced pattern $F_U$—a second magnet subarrangement part $7b$, which is only provided along the predetermined area of outer area $A_o$ and thus locally applies the further magnetic field. Thereby this further field distorts the symmetrical unbalanced field pattern $F_U$ resulting in the asymmetrically unbalanced field pattern $F_{AU}$.

Turning back to preferred embodiments of the present invention, in a first preferred embodiment the target surface is a sputtering surface and plasma treating of the substrate surface is sputter-coating. Nevertheless, the method according to the present invention may also be applied for etching, e.g. for reactive plasma-enhanced etching of the surface of the substrate. In this case the target surface is selected of a material not being sputtered and the magnetron source with the inventively exploited asymmetrically unbalanced field pattern being swept along the surface of the substrate is merely provided for generating the respective plasma distribution. No material is freed from the target surface.

In a further preferred embodiment of the method according to the present invention the component of magnetic field parallel to the substrate surface is selected to be between 1 Gauss and 20 Gauss.

Further preferred, the tunnel-like magnetron field pattern—$F_M$—covers more than 60% of the target surface, thereby even more preferred, more than 85% of the target surface. Thereby, especially with an eye on performing sputter coating of the substrate surface, it is advantageous to apply the addressed covering because it is primarily in the area covered by the magnetron field pattern—$F_M$—in which, due to electron-trap effect, an increased plasma density is reached and material is sputtered off at high rate.

As was addressed above the asymmetrically unbalanced field pattern is realized in one preferred embodiment by disturbing homogeneity of an increased magnetic flux density along the outer area—$A_o$—by locally applying a further magnetic field along said outer area. Thereby, said further magnetic field is preferably generated by at least one permanent magnet and/or at least one electromagnet. Providing an electromagnet allows control of such further magnetic field so that also during processing the asymmetry of the unbalanced field pattern may controllably be varied.

In a further preferred embodiment not only the asymmetrically unbalanced field pattern is swept along the substrate surface, but the magnetron field pattern too. Due to the fact that the magnetron field pattern is also moved with respect to the substrate further increased treatment homogeneity is reached, especially with an eye on sputter coating.

In a further still preferred embodiment sweeping of the asymmetrically unbalanced magnetic field pattern along the substrate surface is performed by circularly moving the unbalanced magnetic field pattern around an axis which is perpendicular to the target surface.

With an eye on FIG. 2 it may be seen that the asymmetrically unbalanced field pattern $F_{AU}$ is moved along a circular path around an axis $A_S$, whereby the location of such axis $A_S$ is selected remote from the area P of maximum flux of the asymmetrically unbalanced field pattern $F_{AU}$.

As further also shown in FIG. 2 in a preferred embodiment sweeping is generated by moving the magnetron—$F_M$—as well as the asymmetrically unbalanced field pattern $F_{AU}$ around an axis which is perpendicular to the target surface and which is offset from a geometrical center—$A_L$—of the inner area $A_i$, so that by such moving both field patterns are swept with respect to the substrate surface.

In a further preferred mode the loop of magnetron field pattern is generated circularly around a loop central axis, as shown in FIG. 2 around axis $A_L$.

In a further preferred embodiment of the method according to the present invention there is generated by the asymmetrically unbalanced field pattern—$F_{AU}$—an area of maximum plasma density as shown at P of FIG. 2 adjacent the periphery of the substrate surface and said maximum area is swept adjacent to and along this periphery.

In FIG. 2 the substrate 6 is shown in dashed line representation. It is centered about axis $A_S$. The area P of maximum plasma density sweeps along the periphery of substrate 6 and adjacent to such periphery.

Further, in a preferred embodiment controlled adjusting of uniformity of ion current density at the substrate surface is performed by adjusting the further magnetic field which, as was explained, is provided for disturbing homogeneity of the unbalanced field pattern to make it asymmetrically unbalanced.

As was already addressed and with an eye on controllability of the asymmetrically unbalanced field pattern—$F_{AU}$— providing an electromagnet for generating such further magnetic field is most advantageous. Thereby, in a further preferred embodiment there is provided at least one coil which generates a magnetic field which is substantially parallel to the target surface. With an eye on FIG. 2 such magnetic field is schematically shown at $F_a$. Thereby, it may be seen that by varying such field $F_a$ generated by the said at least one coil the pattern of the asymmetrically unbalanced field $F_{AU}$ may be controllably adjusted. This leads to the further preferred mode that generating sweeping of the asymmetrically unbalanced pattern along the substrate surface comprises supplying the at least one coil with an alternating current which will generate an alternating field $F_a$, thereby sweeping the pattern $F_{AU}$ and thus the area P in an oscillating manner in the direction of $F_a$. If, in a further preferred embodiment, more than one of these coils are provided which generate respectively magnetic fields in different directions as e.g. and with an eye on FIG. 2 additionally in direction of $F_b$, perpendicularly to the direction of $F_a$, and alternative currents are applied to the respective coils, the asymmetrically unbalanced field pattern $F_{AU}$ and thus area P will be swept in two dimensions along the surface of the substrate 6 and by appropriately selecting amplitudes, mutual phasing and/or frequencies of the alternating currents applied to the coil the sweeping pattern may be selected and controllably adjusted in the sense of realizing for sweeping of area P Lissajoux patterns along the substrate surface.

In a further preferred embodiment the substrate is selected to be circular and the asymmetrically unbalanced field pattern is swept around a center axis of the substrate, whereby if more than one substrate is provided the substrates are arranged within a circular area and the center axis is defined with respect to such circular area.

In a further preferred embodiment the current of ions at the substrate surface is adjusted by adjusting magnetic field components perpendicular to the substrate surface. Such component is on one hand adjustable by adjusting the asymmetrically unbalanced field pattern $F_{AU}$, but may additionally or alternatively be performed by applying, e.g. by means of a Helmholtz coil arrangement, a controllably variable additional magnetic field perpendicularly to the substrate surface, namely a magnetic field $F_c$ as shown in FIG. 2. In a further preferred embodiment the electron current in the plasma is guided substantially perpendicular to the target surface towards the substrate surface which may be realized by applying a respective electrical potential difference between target surface and substrate surface and/or by providing appropriate shielding.

In a further preferred mode the plasma as generated is electrically fed by a pulsating supply voltage. Thereby, further preferred, the frequency f of pulsating is selected to be $$5\text{ kHz} \leq f \leq 500\text{ kHz}$$

thereby to be preferably $$100\text{ kHz} \leq f \leq 200\text{ kHz}.$$

In a further preferred embodiment the duty cycle of such pulsating is selected to have 1% to 99% off-times (both values included), thereby to have, even more preferred, off-times of between 35% and 50% (both limits included). Especially for long-throw and/or IPVD applications there is established a total pressure in the vacuum chamber to be at most $10^{-1}$ Pa, thereby preferably $$10^{-2}\text{ Pa} \leq p \leq 5 \times 10^{-2}\text{ Pa}.$$

Further, in a preferred mode the substrate is biased with an Rf frequency power, whereby adjusting of the energy of ions bombarding the substrate surface comprises adjusting such Rf power. In a specially preferred embodiment for sputter-coating the substrate surface the target surface is provided with a sputtering surface of one of Ti, Ta, Cu. With an eye on FIGS. 1 and 2 it must be emphasized that the magnet arrangement which generates the magnetron field pattern $F_M$ is not necessarily selected circularly as shown in these figures, but such magnetron field pattern and respectively the magnet arrangements generating such pattern may be conceived to achieve a desired target erosion profile in sputter coating and a required thickness uniformity of coating on the substrate surface.

Appropriately tailoring the magnetron field pattern $F_M$ and especially its looping shape in a view towards the target surface is known in a huge variety to achieve the addressed desired results.

Following up the above mentioned object there is further proposed a magnetron source which comprises
- a target with a target surface and an opposite surface;
- a magnet arrangement adjacent the opposite side and having
  - at least one first magnet subarrangement;
  - at least one second magnet subarrangement;
  - said first magnet subarrangement having a first area pointing towards the opposite surface of said target and being of one magnetic polarity;
  - the second magnet subarrangement having a second area pointing towards the opposite surface of said target and having the other magnetic polarity;
  - the second area forming a loop around and distant from the first area;
  - the first area generating a first magnetic flux through the target surface;
  - the second area generating a second magnetic flux through the target surface and wherein
  - the second magnetic flux is larger than the first magnetic flux and is unevenly distributed along the second area.
- a sweeping arrangement which moves the unevenly distributed magnetic flux along the target surface.

According to the present invention there is further proposed a magnetron treatment chamber which comprises a magnetron source according to the present invention and as was generically discussed above as well as a substrate carrier which is remote from and opposite to the target surface of the magnetron source.

Additionally to the figures addressed and the disclosure given above the present invention shall become even clearer to the skilled artisan by the further description of preferred embodiments by means of figures as well as by the appending claims. The further figures show:

DETAILED DESCRIPTION OF EMBODIMENTS

Figure 3:
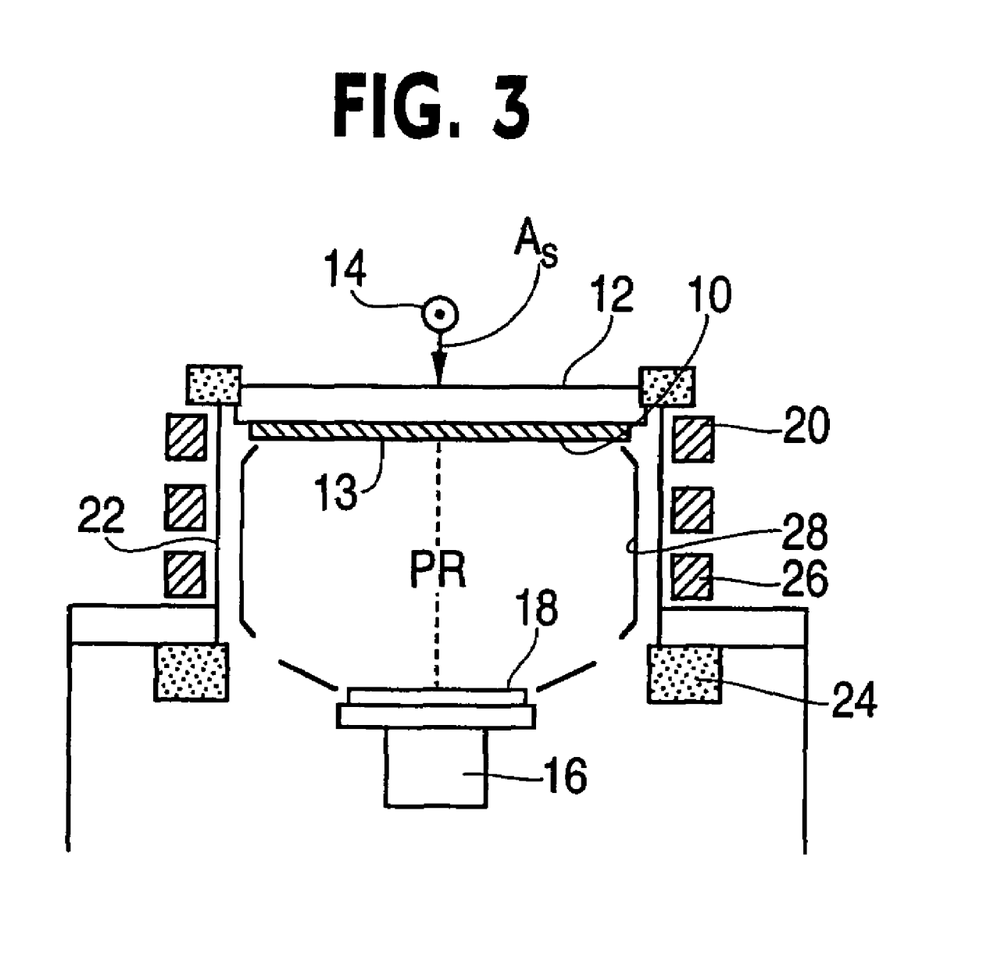
FIG. 3 most schematically and simplified a magnetron treatment chamber according to the present invention incorporating a magnetron source according to the present invention and operated for manufacturing substrates according to the present invention.

In FIG. 3 there is schematically and simplified shown a treatment chamber according to the present invention, especially a sputter-coating chamber, incorporating a magnetron source according to the present invention and performing the method of manufacturing according to the present invention. The treatment chamber according to FIG. 3 is the today's preferred embodiment which is trimmed for long-throw and/or IPVD sputter coating of substrates and combines preferred features, some of which may be deleted for specific applications.

The chamber comprises a circular target 10 and a magnet arrangement 12 driven around rotational axis $A_S$ by means of a motor drive as schematically shown at 14. Opposite the sputtering surface 13 of the target 10 and centered on axis $A_S$ there is provided a substrate carrier 16 for centrally positioning a substrate arrangement 18 of one or more than one substrate to be sputter-coated. At least one coil 20 is mounted outside and along the walls 22 of the sputtering chamber with a coil axis coincident with axis $A_S$. Additionally or alternatively permanent magnets can be used to generate a magnetic field coaxially to axis $A_S$. An anode arrangement 24 is provided adjacent to the substrate carrier 16 and is substantially hidden from the processing space PR by means of a first shield 26 and a second shield 28 which shields substantially confine the processing space with respect to anode arrangement 24 and inner surface of chamber wall 22. The substrate carrier 16 is either operated electrically floating or on a DC bias potential or on an AC or AC plus DC potential, up to and preferably to frequencies in Rf range.

By means of the first and second shieldings 26 and 28 electrons within the plasma processing space PR are substantially hindered from flowing onto the chamber wall 22. The shields 26 and 28 may equally or differently be operated at electrically floating potential or on a DC potential, thereby preferably on an anodic electric potential. At least shield 28 is preferably electrically operated on an electric potential which is more negative than the electric potential applied to anode arrangement 24.

Thereby, only one, two or more shields may be provided electrically driven differently or equally. By such shields electrons in the plasma and in the processing space PR are guided to flow substantially parallel to the axis $A_S$ towards the substrate arrangement 18 on the substrate carrier 16. For certain applications it is also possible not to use any lateral shielding.

By means of the at least one coil 20 there is generated an additional magnetic field, $F_C$ in FIG. 2, in the processing space PR substantially parallel to the axis $A_S$. It is also possible not to make use of any such coil arrangement 20 or to provide more than one such coil arrangement. They are (not shown) operated with DC power. The orientation of the magnetic field generated by the coils 20 may be oriented in one and the same direction, or at least one coil can generate a magnetic field in opposite direction to produce mirror-like magnetic fields.

For experiments the chamber as schematically shown in FIG. 3 was conceived as follows:

| | |
|---|---|
| Target material: | Ti |
| Target diameter: | 300 mm |
| Shape of processing chamber and shieldings: | cylindrical |
| Distance from substrate carrier to sputtering surface: | 330 mm/370 mm |
| Diameter of circular single substrate carrier: | 200 or 150 mm |
| Supply of plasma discharge: | DC or pulsed power |
| Single coil current: | 10 A |
| Axial magnetic field by single coil: | 10 Gauss |
| Bias of the substrate carrier: | DC power |
| Target-to-substrate distance: | 37 cm |

As a first reference experiment the magnet system 12 was conceived according to FIG. 1. Thus, there was applied an unbalanced magnetron with cylindrically symmetrical design. The long range of the symmetrically unbalanced magnet field pattern $F_U$ according to FIG. 1 was varied by varying the DC current supply of the coil arrangement 20 according to FIG. 3 with current polarity strengthening the unbalancing magnetic field pattern $F_U$ according to FIG. 1. The large area symmetrical unbalanced magnetron arrangement was operated at a very low working gas pressure as of Ar, down to 0.025 Pa.

With an eye on FIG. 1 it becomes clear that rotating this magnet arrangement around the loop central axis $A_L$, which is coincident with axis $A_S$ as of FIG. 3, has no effect.

As a function of the coil current in coil arrangement 20 there is generated a sharply focused plasma beam concentrated in the centre of the substrate.

Figure 4:
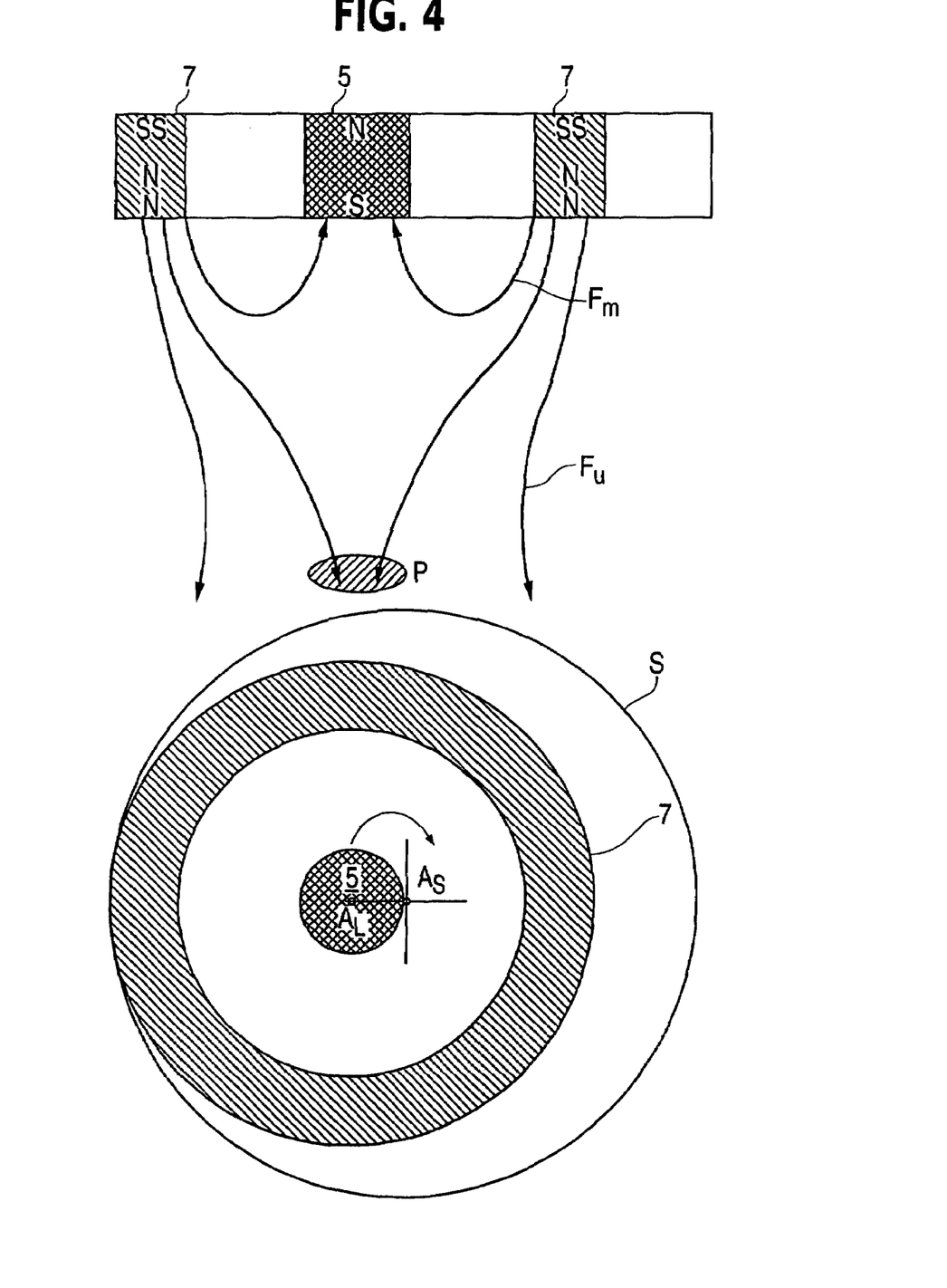
FIG. 4 in a representation in analogy to those of the FIGS. 1 and 2, the realization of a symmetrically unbalanced field pattern which is swept along a substrate surface by being moved around an axis perpendicular to the target surface.
Figure 5:
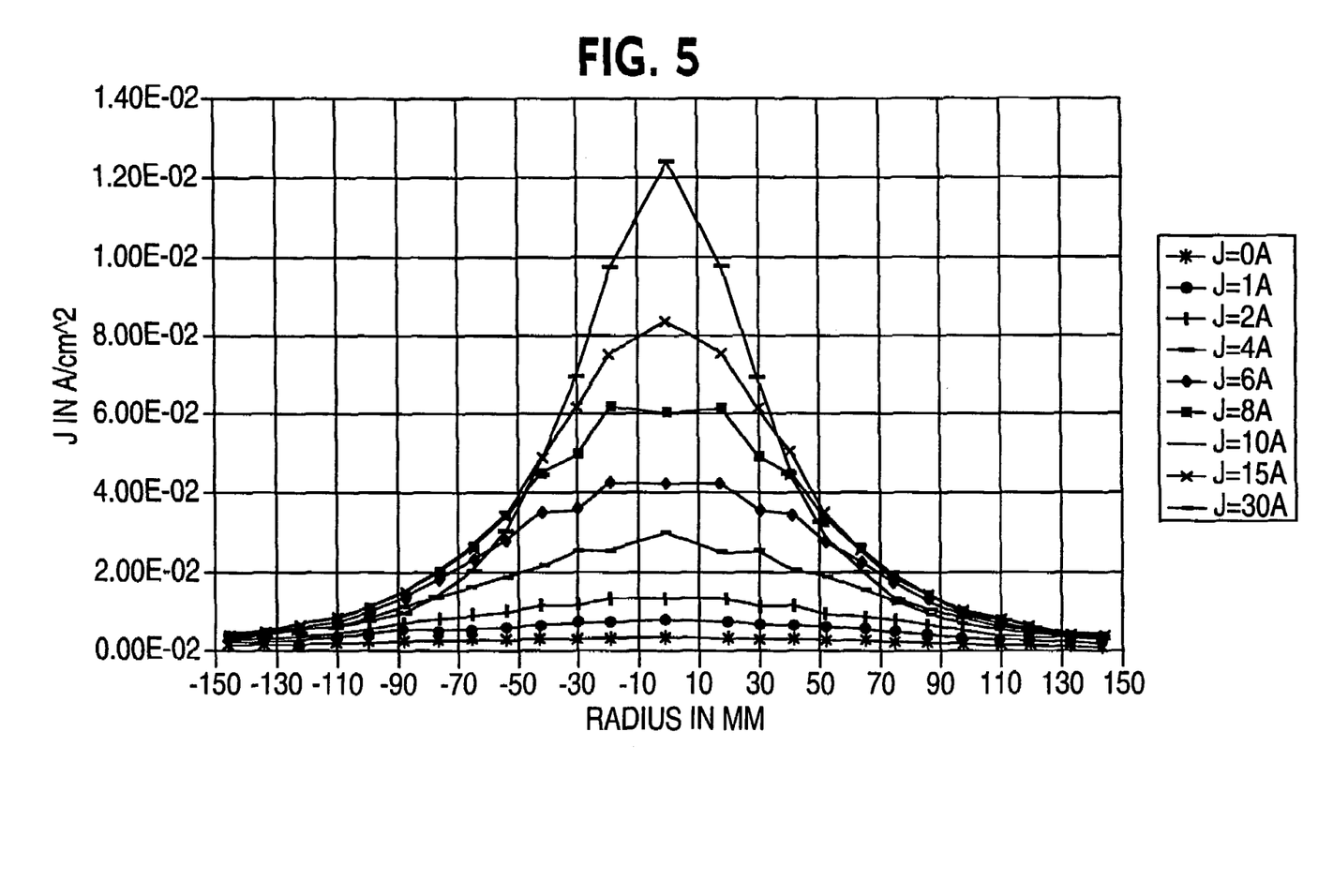
FIG. 5 over the radius of a circular substrate the ion current density as resulting from operating the chamber as of FIG. 3 configured with the source as of FIG. 4 and with varying coil current—J—parameter.

As a next reference experiment the magnet system 12 was changed from the system according to FIG. 1 to the system according to FIG. 4, still a prior art magnet system, e.g. according to the U.S. Pat. No. 6,352,629. The magnet system as shown in FIG. 4 is different with respect to that shown in FIG. 1 by the fact that the loop central axis $A_L$ is offset from the rotating axis $A_S$. In the specific experiment considered the loop central axis $A_L$ was offset from the axis $A_S$ by a relatively small amount of 15 mm. This to keep the advantage of a large plasma confinement by the large symmetrically unbalanced magnetron covering nearly the full sputtering surface of the target (FIG. 4). The ion density along the substrate surface to be sputter-coated was measured. The result is shown in FIG. 5.

In spite of the fact that the symmetrically unbalancing field pattern $F_U$ is swept along the surface of the substrate arrangement with a maximum density area P according to FIG. 4 offset from the rotational axis $A_S$, there resulted a centrally focused plasma distribution up to a sharply focused plasma beam in dependency of the coil current applied. The coil current by which the characteristics of FIG. 5 are parameterized varies between 0 and 30 A. Further, there were applied five coil arrangements 20 as of FIG. 3 operated at equal DC currents.

The substrate holder 16 of FIG. 3 was operated at a bias of −80 V DC, an Ar flow was established of 15 sccm and a total pressure p of 0.14 Pa. The distance established between the sputtering surface and the substrate was 370 mm to experience long-throw effect.

Figure 6:
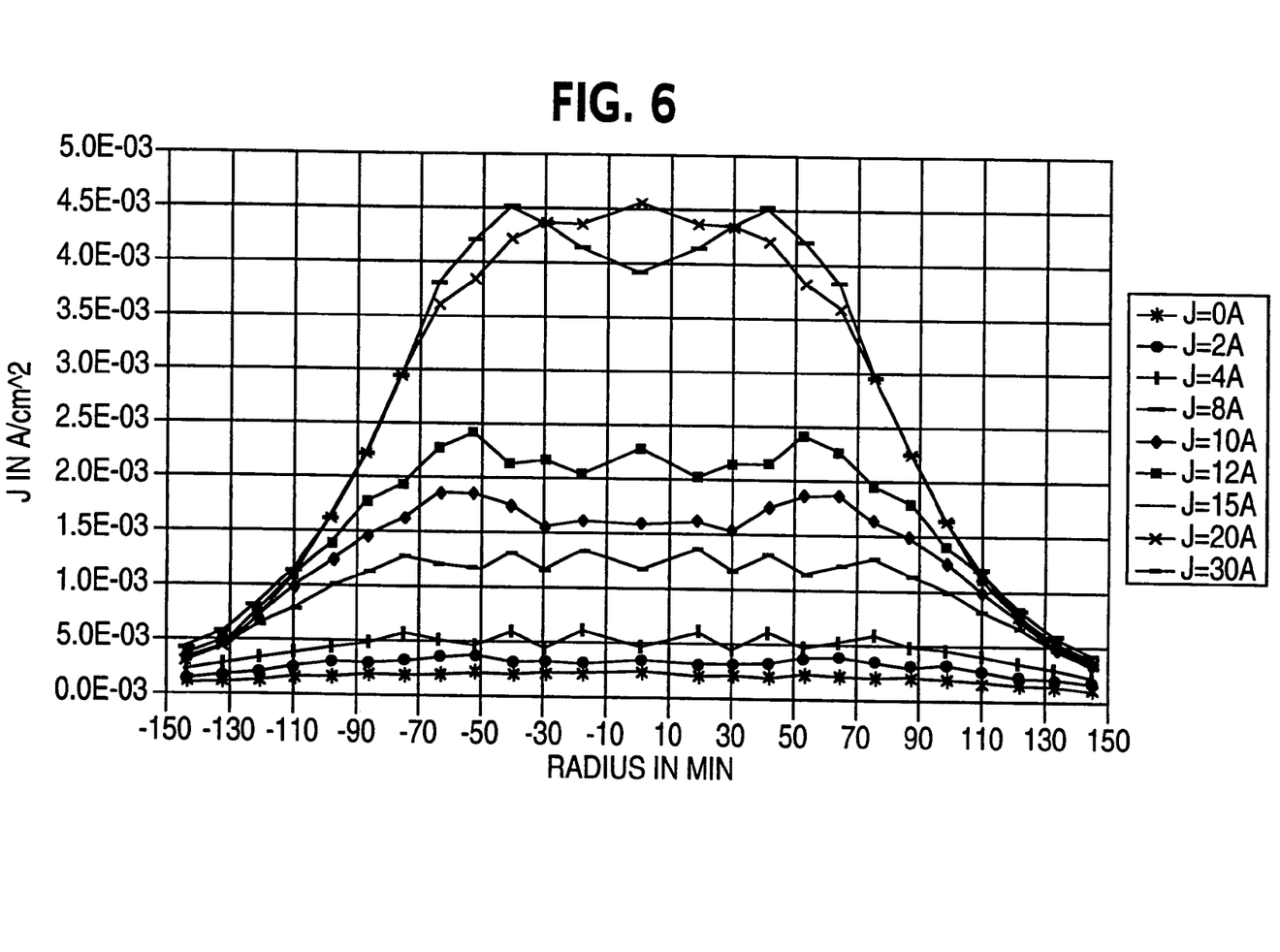
FIG. 6 in a representation in analogy to that of FIG. 5 the ion current density as results when the chamber as of FIG. 3 is operated according to the present invention with an asymmetrically unbalanced field pattern as of FIG. 2, again with different coil currents—J—as parameter.

As a third experiment now according to the present invention the magnet arrangement was changed to that as shown and as was described with the help of FIG. 2. The respective result is shown in FIG. 6 in analogy to the results of FIG. 5. It may clearly be seen that again dependent on the coil current the current density may be increased to values up to those experienced according to FIG. 5, but with a significantly improved uniformity of plasma density distribution and thus ion density distribution along the substrate arrangement surface, up to a radius of 100 mm. This is especially true for a medium-range coil current of 4 to 10 A.

Figure 7:
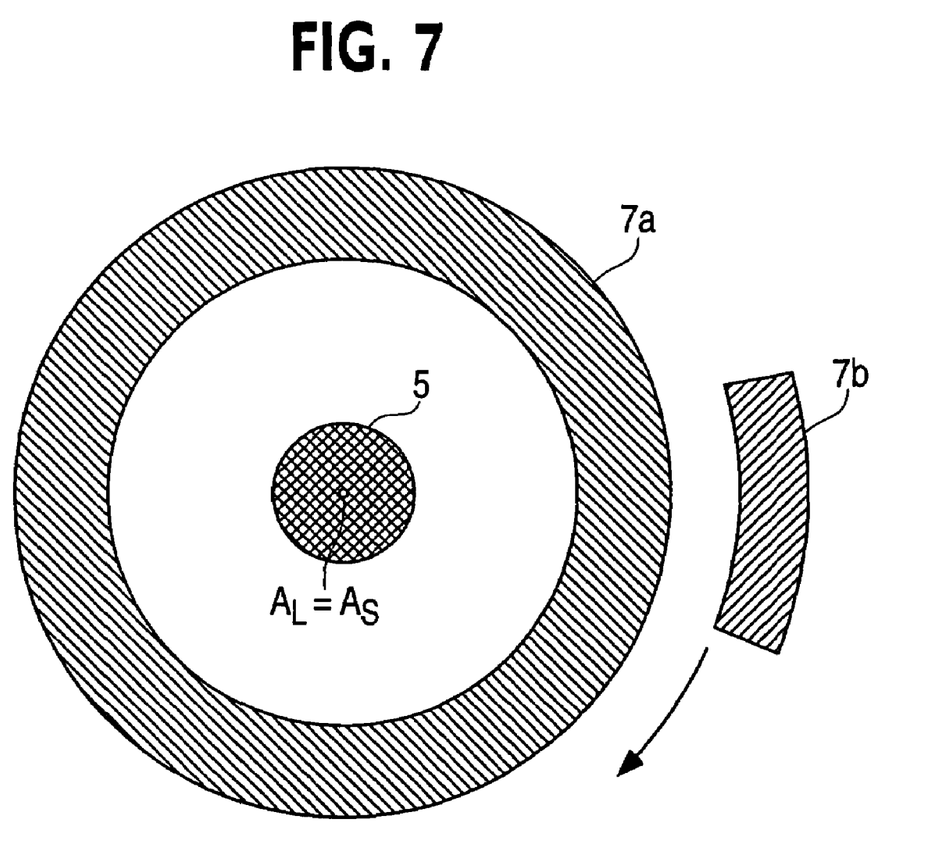
FIG. 7 in a most schematic representation a further embodiment for realizing an asymmetrically unbalanced magnetic field pattern swept along the substrate surface.

With an eye back on the magnet arrangement of FIG. 2 and as was already addressed in the introductory part, FIG. 7 shows in a representation in analogy to that of FIG. 2 an alternative technique of sweeping the maximum plasma density area P along the surface of the substrate arrangement. Thereby, the first and second magnet subarrangements 5 and 7 are kept stationary, looping around the loop centre axis $A_L$ which is coincident with the rotational axis $A_S$ which is further the central axis of the substrate arrangement. Thereby there is first generated a symmetrical unbalanced magnetron field according to FIG. 1. The part $7_b$ of the second magnet arrangement 7, which is responsible for achieving asymmetrical unbalancing as was explained with the help of FIG. 2, is drivingly rotated around the central axis $A_L=A_S$, thereby sweeping cyclically the maximum plasma density area P as of FIG. 2 along and adjacent (not shown) the substrate surface.

Figure 8:
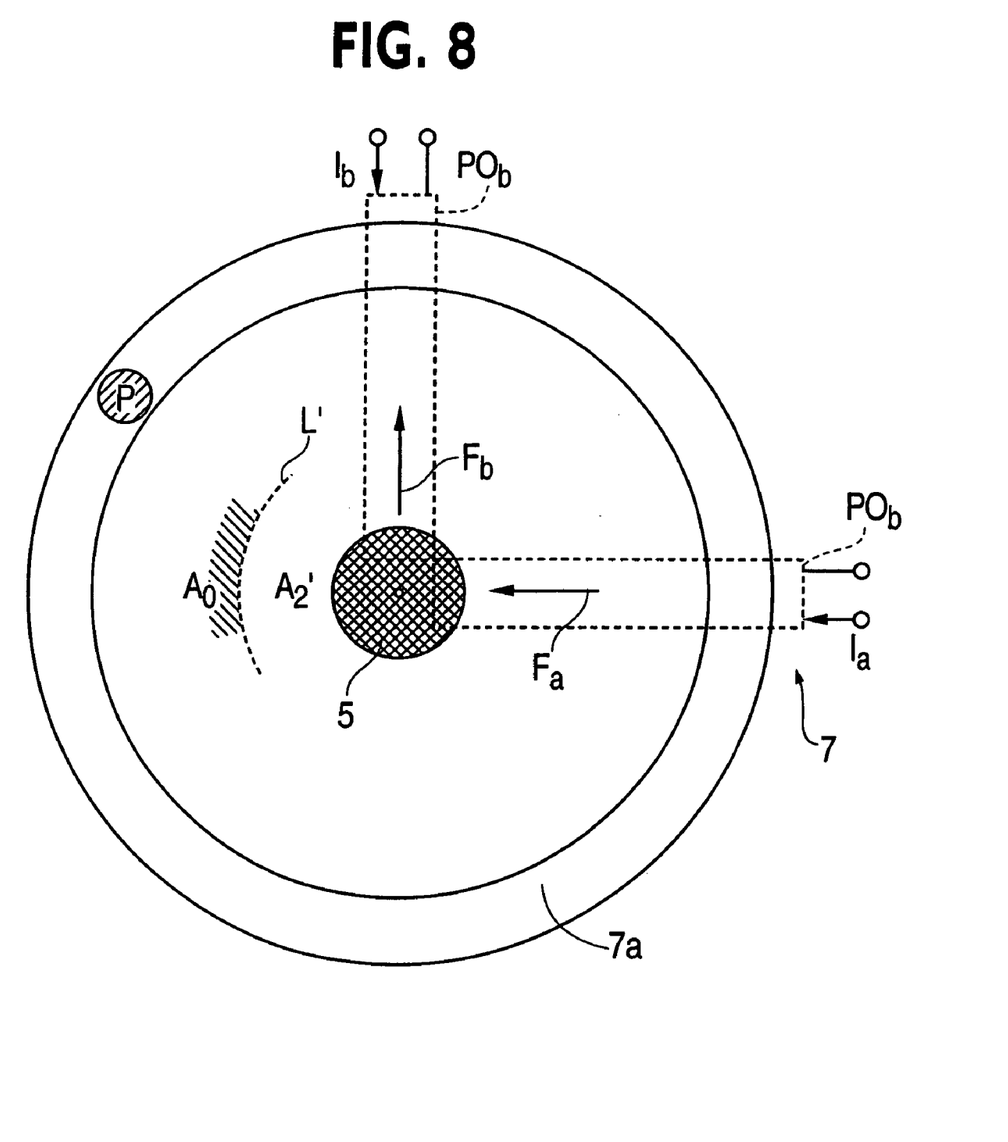
FIG. 8 in a representation in analogy to that of FIG. 7 still a further embodiment for realizing the asymmetrically unbalanced field pattern and sweeping with such field pattern along the surface of the substrate.

FIG. 8 shows in a representation in analogy to that of FIG. 7 a further preferred embodiment for generating the asymmetrically unbalanced magnetic field pattern $F_{AU}$ as of FIG. 2 and sweeping this pattern along the substrate surface. Again the magnetron field pattern $F_M$ is generated between part 7a of magnet subarrangement 7 along the outer area $A_o$ and the magnet subarrangement 5 at the inner area $A_i$. The part 7a of the outer magnet subarrangement 7 provides for the symmetrically unbalanced field pattern $F_u$ according to FIG. 2. Asymmetry is realized by providing a first coil arrangement $80_a$ adjacent and below the target surface at the magnet subarrangement 7 which coil arrangement $80_a$ generates a magnetic field $F_a$, as shown also in FIG. 2, parallel to and in radial direction along the target surface. As now evident to the skilled artisan by applying this magnetic field $F_a$ the formerly symmetrically unbalanced magnetic field pattern $F_U$ becomes an asymmetrical unbalanced field pattern $F_{AU}$. By applying to the coil arrangement $80_a$, which is in fact an electromagnet arrangement, an alternating current $I_a$ the area P of maximum field flux as of FIG. 2 is swept along the substrate surface forth and back as a function of amplitude of the applied current, shape of the current course over time, and frequency.

Whenever, in a further preferred embodiment, there is applied at least one second coil arrangement $80_b$, the same prevails as was explained with respect to the effect of coil arrangement $80_a$, but because the second coil arrangement $80_b$ generates a magnetic field $F_b$ as also shown in FIG. 2 e.g. perpendicularly to the direction of field $F_a$, the area P of maximum flux is moved along the substrate surface as a result of the superposition of the two magnetic field components $F_a$ and $F_b$. As known by the skilled artisan the trajectory path of area P along the substrate surface may controllably be adjusted by selecting mutual phasing of the two currents $I_a$, $I_b$ feeding the two coil arrangements, their amplitudes, their frequencies as well as the shape of their time courses. Controlling the trajectory path of area P is thus realized following principally the well-known rules of Lissajoux.

Figure 9:
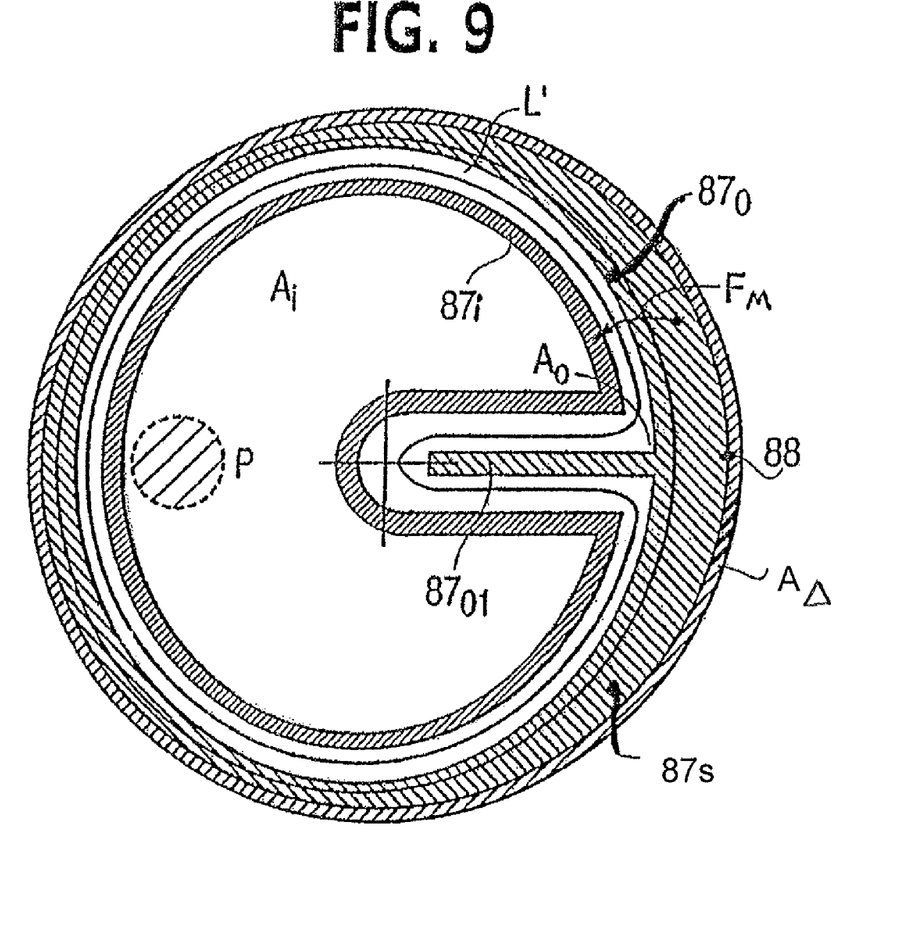
FIG. 9 in a simplified and schematic representation in analogy to that of the FIGS. 1, 2 and 4 a further embodiment of target and magnet arrangement to generate an asymmetrically unbalanced field pattern according to the present invention.
Figure 10:
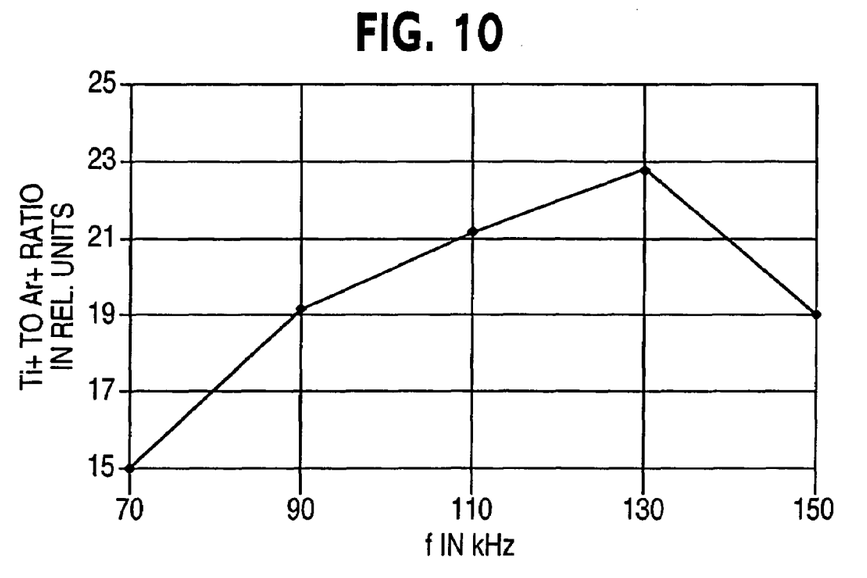
FIG. 10 as a function of pulsating frequency the ratio of metal ions Ti+ to argon ions Ar+ resulting at the substrate surface when treated according to the present invention, thereby supplying the magnetron source with a pulsating voltage of the addressed frequency.
Figure 11:
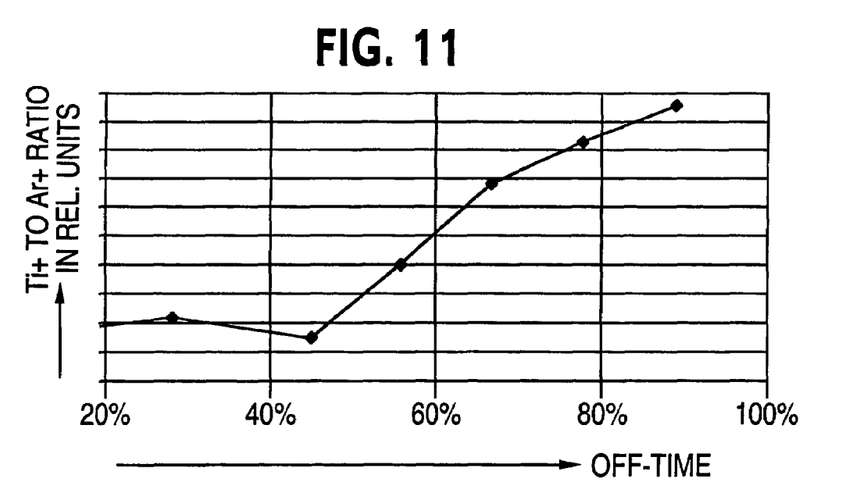
FIG. 11 the ratio as of FIG. 9 as a function of off-time % of said pulsating supply voltage with respect to pulse repetition period.

FIG. 9 shows a further embodiment of a magnet assembly at the target resulting in an asymmetrically unbalanced magnet field pattern. This assembly has a first looping magnet subarrangement $87_o$ of one polarity and having a radius-like extension $87_{o1}$. The second magnet subarrangement $87_i$ is provided distant from and along the outer magnet subarrangement $87_o$. These two magnet subarrangements do generate on one hand the magnetron field pattern $F_M$ and the asymmetrically unbalanced field pattern with an area P of maximum flux as shown in FIG. 9. The locus of zero field component of the magnetron field pattern $F_M$ defines for the locus L' as was already shown in FIGS. 1 and 2, thereby confining the outer area $A_o$ with respect to the inner area $A_i$. Thereby, at the right-hand side of the arrangement of FIG. 9 an outer, third magnet subarrangement $87_s$ projects crescent shaped towards the respective edge of the target arrangement shown at 88. A projecting area $A_A$ of magnet subarrangement $87_s$ causes the asymmetry of the unbalanced magnetic field. Only at that area $A_A$ the magnetron field pattern $F_M$ does not emanate from the target surface which is limited at line 88. This area $A_A$ is not more than 12% of the target surface area. When performing the method according to the present invention, i.e. operating the magnetron source and magnetron chamber, especially for sputter-coating the following further settings are preferred: The plasma is preferably fed with a power in the range of 0.1 to 60 kW, thereby even more preferred within a range of 1 to 40 kW.

The target surface is preferably exposed to a plasma density of 0.1 to 900 W/cm$^2$, thereby even more preferred to a plasma density of between 10 and 50 W/cm$^2$.

As was already addressed and in spite of the fact that the substrate may also be biased with DC, such biasing is preferably realized with Rf power. Such biasing Rf power has preferably a power density of 0.01 to 10 W/cm$^2$, even more preferred of 0.2 to 2 W/cm$^2$ per cm$^2$ of substrate surface.

Ion bombarding of the substrate is preferably adjusted to energy values of between 0.1 eV and 300 eV, which preferably comprises appropriately adjusting the Rf power which biases the substrate.

Further, especially when performing long-throw sputter-coating, the energy of ions bombarding the substrate surface is adjusted to values between 0.01 eV and 50 eV and the ion density of these ions is adjusted to less than 0.2 mA/cm$^2$ preferably by adjusting the gas pressure within the range of $10^{-2}$ Pa $\leq p \leq 5 \times 10^{-2}$ Pa and the magnetic flux perpendicular to the substrate surface to a value which is less than 0.5 Gauss.

For IPVD application the energy of ions bombarding the substrate is adjusted preferably to values between 20 eV and 300 eV and the ion density of these ions is selected in the range of 0.2 to 10 mA/cm² by setting working gas pressure in the vacuum chamber between $3\times10^{-2}$ Pa and $5\times10^{-1}$ Pa, selecting the magnetic field perpendicularly to the substrate surface to be between 0.5 Gauss and 50 Gauss.

The radial uniformity of ion current density at the substrate surface is further preferably adjusted by adjusting the magnetic flux of the magnetic field component perpendicularly to the substrate surface. Especially when long-throw sputtering one of the metals Ti, Ta or Cu the metal ionization degree adjacent the substrate surface is adjusted preferably to a level of less than 10% which is done by adjusting at least one of pressure, electric power to the magnetron source, pulsing characteristic of the electrical magnetron supply and magnetic flux of field components perpendicular to the substrate surface.

On the other hand e.g. when sputtering Ti, Ta or Cu the metal ionization may be selected at a level which is more than 20%, even more than 50%, by adjusting at least one of pressure in the magnetron chamber, electric power applied to the magnetron source, pulsating characteristic of supply power to the magnetron source and magnetic flux of magnetic field perpendicularly to the substrate surface. Further, whenever holes in a substrate have to be coated by the method according to the present invention this is preferably performed in at least two subsequent steps. The first step consists of a long-throw sputtering step with metal ionization degree especially of one of the metals Ti, Ta, Cu of more than 20%, preferably even of more than 50%, which is adjusted as was just outlined above. In a second subsequent step, which is an IPVD step, the metal ionization degree of the addressed metal is adjusted by the parameters as outlined above to a level which is less than 10%.

In a further preferred embodiment of the present invention the plasma is generated only for ignition with the help of a working gas as e.g. argon and then only metal atoms are present in the reaction volume of the chamber.

Further, and with an eye on the magnetron chamber as shown in FIG. 3 the asymmetrically unbalanced magnetic field pattern which is swept along the substrate surface may be passed during predetermined amounts of time or during predetermined extents of sweeping trajectory path, beneath a magnetic shield provided between the magnetron source and substrate surface so as to shield at least a part of the asymmetrically unbalanced magnetic field pattern from reaching and affecting treatment at the substrate surface.

Figure 12:
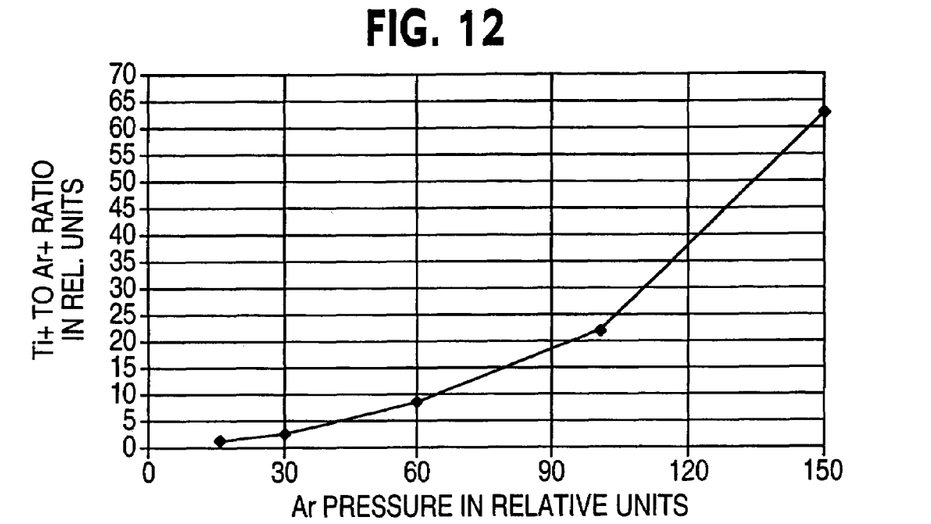
FIG. 12 again the addressed ratio as a function of working gas pressure, namely argon pressure, and FIG. 13 again the addressed metal ions to working gas ions ratio as a function of electrical power supplied to the magnetron source.
Figure 13:
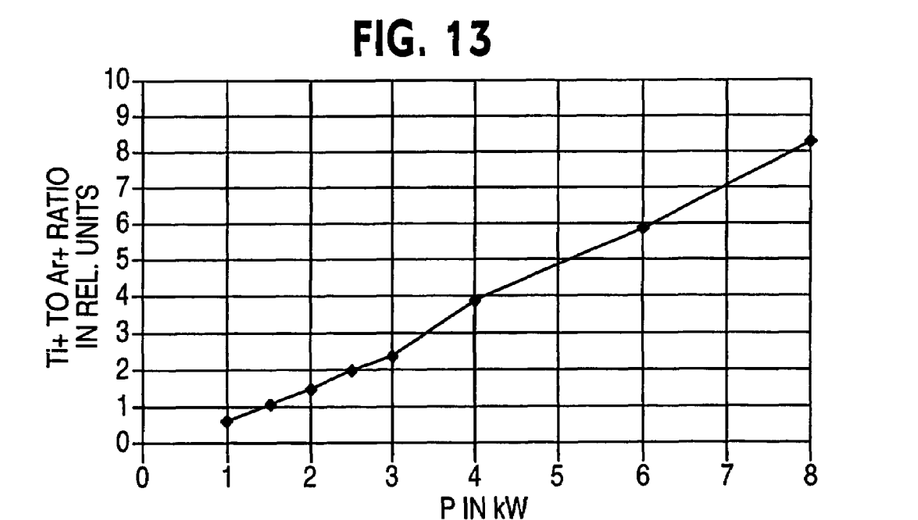

Experiments have been performed to determine the metal ionization ratio and its dependencies at the substrate surface which led to the above preferred embodiments. An energy-resolved mass spectrometer was used to measure the ratio between the intensity of Ti ions $^{48}Ti^+$ and argon ions $^{36}Ar^+$. The ratio of their intensities reflects the metal ionization probability. The results are shown in the FIGS. 10 to 13. One can see that the rate of metal ionization can vary in a very broad range. Higher working gas pressure as well as higher sputtering power according to the results of FIGS. 12 and 13 lead to an increase of Ti ionization relative to Ar ionization, even when DC sputtering.

Moreover with predetermined fixed electrical supply power to the magnetron source and predetermined fixed pressure in the magnetron chamber pulsating of the magnetron supply and thus of the magnetron discharge helps to ionize the metal with increased degree. From FIG. 11 where the metal ionization ratio is shown in dependency of the percentage amount of off-time at the pulsating electric magnetron source supply it becomes evident that with increasing off-time percentage the metal ionization increases. At a duty cycle with 50% off-times of the pulsating electrical magnetron source supply FIG. 10 reveals a preferred optimum frequency range between 100 and 200 kHz for optimum metal ionization.

Especially in long-throw sputtering mode the coating of the bottom and sidewalls of high-aspect ratio holes in the substrate surface can be realized with neutral metal atoms sputtered at very low working gas flows and thus low pressures between $5\times10^{-3}$ Pa and $5\times10^{-2}$ Pa to avoid collision between metal atoms and gas atoms. The described large coverage of the whole target surface with plasma also during ON-time spans of the pulsating supply of the magnetron source allows working at extremely low-pressure neutral metal atoms eliminating damage of the holes in the substrate surface by excessive ion bombardment.

The arrangement also allows an IPVD step using higher pressures for higher bottom and sidewall coverage exploiting all the effects of high ionization including the resputtering by argon and metal ions.

Especially for IPVD applications, where the bottom of holes with high aspect ratio is coated by metal ions and resputtering from the bottom layer coats the sidewalls, a high flow and thus high pressure between $5\times10^{-2}$ Pa and 2 Pa is used to create predominantly metal ion deposition. Measurements have shown that the processing according to the present invention is able to produce more than 50% ionization in the case of Ti sputtering when all the plasma confinement and ionization facilities are used: The asymmetrically unbalanced field pattern, the confining field of the coils 20 as of FIG. 3, floating shielding 28 and 26 of FIG. 3, an anode 24 close to the substrate, selecting proper pressure range and pulsating the electrical magnetron source supply as described above. It should be stressed that the same configuration allows a uniform ion current density over the substrate in the range below 5% resulting in very uniform conditions for step coverage at the substrate.

The invention claimed is:

1. A method of manufacturing substrates with a vacuum plasma treated surface comprising the steps of
    providing a target with a target surface being circular about an axis;
    providing at least one substrate distant from and opposite said target surface having a substrate surface;
    generating in the volume between said target surface and said substrate surface a magnetic field pattern of
    a) a magnetron field pattern forming, considered in direction towards said target surface:
        a substantially circular closed loop eccentrically with respect to said axis and along said target surface, said substantially circular closed loop having a radial extension extending towards a center area of said substantially circular closed loop and considered parallel to said target surface, tunnel-like arcing from an outer area of first magnetic pole to an inner area of second magnetic pole, whereby said inner area is confined with respect to said outer area by a locus of zero component of magnetic field perpendicular to said target surface, said locus being substantially circular and closed loop about said center area and having a respective radial extension extending towards said center area,
    b) an unbalanced long-range field pattern which is asymmetrical generated by an additional magnetic flux along a distinct area of said outer area relative to magnetic flux along said inner area and relative to the remainder of said outer area;

said distinct area extending along the periphery of said target surface thereby crescent shaped increasing said outer area; said long range field pattern reaching the substrate surface having a component of magnetic field parallel to said substrate of at least 0.1 Gauss, generating a plasma discharge in said magnetic field pattern;

plasma treating said substrate surface, thereby sweeping said magnetic field pattern along said target surface, by rotational movement about said axis.

2. The method of claim 1, wherein said component of magnetic field parallel to said substrate surface is selected to be between 1 G and 20G.

3. The method of claim 1, further comprising covering with said tunnel-like magnetron field pattern more than 60% of said target surface.

4. The method of claim 1, thereby covering with said tunnel-like magnetron field pattern more than 85% of said target surface.

5. The method of claim 1, further comprising adjusting uniformity of ion current density at said substrate surface by adjusting said flux along said distinct area.

6. The method of claim 1, further comprising providing more than one substrate.

7. The method of claim 6, further comprising the step of selecting said more than one substrate to be arranged within a circular area, sweeping said unbalanced field pattern around a center axis of said circular area.

8. The method of claim 1, further comprising the step of selecting said substrate to be circular, sweeping said unbalanced field pattern around a center axis of said substrate.

9. A magnetron source comprising
a target with a target surface and an opposite surface circular about an axis;
a magnet arrangement adjacent said opposite surface and having:
a first magnet subarrangement;
a second magnet subarrangement;
said first magnet subarrangement defining a first area pointing towards said opposite surface and of one magnetic polarity, said first area forming a substantially circular loop along said opposite surface, eccentrically with respect to said axis, said first magnet subarrangement having a radial extension extending towards a center of said loop;
said second magnet subarrangement defining a second area pointing towards said opposite surface and of the other magnetic polarity;
said second area forming a closed loop inside, along and spaced from said first area;
said first area generating a first magnetic flux through said target surface;
said second area generating a second magnetic flux through said target surface;
a third magnet sub-arrangement opposite said opposite surface generating a third magnetic flux superimposed to said first magnetic flux through said target surface, thereby resulting in a resultant magnetic flux along a distinct, crescent shaped area which is larger than said first magnetic flux along the remainder of said first area, therby generating an unbalanced, asymmetric, long-range magnetic field, said distinct, crescent shaped area increasing the extent of said first area;
a sweeping arrangement rotationally moving said first, second and third magnet sub-arrangements about said axis.

10. A magnetron treatment chamber comprising a magnetron source as claimed in claim 9 and a substrate carrier remote from and opposite to the target surface of said magnetron source.

11. The chamber of claim 10, further comprising an anode arrangement adjacent said substrate carrier.

12. The chamber of claim 11, further comprising a shield confining a process area between said source and said substrate carrier and being electrically floating or on an anodic potential.

13. The chamber of claim 11, wherein said anode is hidden behind a shield arrangement and with respect to processing volume.

14. The chamber of claim 10, further comprising at least one coil with a coil axis perpendicular to the target surface of said source.

15. The chamber of claim 10, wherein said substrate carrier is electrically floating or connectable to a predetermined biasing potential.

* * * * *